United States Patent
Guo et al.

(10) Patent No.: US 12,224,177 B2
(45) Date of Patent: Feb. 11, 2025

(54) METHOD OF RUNNING AN ETCH PROCESS IN HIGHER SELECTIVITY TO MASK AND POLYMER REGIME BY USING A CYCLIC ETCH PROCESS

(71) Applicant: American Air Liquide, Inc., Fremont, CA (US)

(72) Inventors: Xiangyu Guo, Bear (DE); Nathan Stafford, Damascus, OR (US)

(73) Assignee: American Air Liquide, Inc., Fremont, CA (US)

( * ) Notice: Subject to any disclaimer, the term of this patent is extended or adjusted under 35 U.S.C. 154(b) by 413 days.

(21) Appl. No.: 17/666,725

(22) Filed: Feb. 8, 2022

(65) Prior Publication Data
US 2023/0253212 A1    Aug. 10, 2023

(51) Int. Cl.
*H01L 21/311* (2006.01)
(52) U.S. Cl.
CPC .. *H01L 21/31116* (2013.01); *H01L 21/31138* (2013.01); *H01L 21/31144* (2013.01)
(58) Field of Classification Search
None
See application file for complete search history.

(56) References Cited

U.S. PATENT DOCUMENTS 9,514,959 B2    12/2016  Anderson et al.
2006/0116120 A1   10/2006  Rusu et al.
2019/0206696 A1*  7/2019   Hsu ............... H01L 21/32135
2019/0206723 A1   7/2019   Tokashiki et al.
2021/0043461 A1   2/2021   Watanabe et al.

FOREIGN PATENT DOCUMENTS

JP    2006 100485    4/2006

OTHER PUBLICATIONS

International Search Report and Written Opinion for corresponding PCT/US2023/012498, Apr. 18, 2023.

* cited by examiner

*Primary Examiner* — Roberts P Culbert
(74) *Attorney, Agent, or Firm* — Allen E. White; Yan Jiang

(57) ABSTRACT

This disclosure describes an improved etch selectivity of a-C mask during HAR etch processes by using a cyclic etch process. The process has two principle steps:
1) A partial etch using a polymerizing etching recipe with lower $O_2$ and extra polymer generation where a-C mask selectivity to dielectric (e.g. for $SiO_2$ or ONON layers) is high; and
2) A polymer cleaning step using Kr sputter, Xe sputter, $NF_3$, $SF_6$, $IF_7$, $IF_5$, $CF_4$, or other F based etching process, with or without bias, to etch the polymer. The polymer cleaning step may include addition of O containing molecules such as $O_2$, CO, $CO_2$, NO, $NO_2$, $N_2O$, $SO_2$, and/or COS.

These steps are repeated between a partial etch process (polymer creating) and polymer cleaning step (cycle etching).

15 Claims, 2 Drawing Sheets

METHOD OF RUNNING AN ETCH PROCESS IN HIGHER SELECTIVITY TO MASK AND POLYMER REGIME BY USING A CYCLIC ETCH PROCESS

TECHNICAL FIELD

The disclosure relates to plasma etching processes used in semiconductor manufacturing.

The present invention is at least industrially applicable to plasma etching processes used in semiconductor manufacturing.

BACKGROUND ART

Plasma etching of high aspect ratio (HAR) features in $SiO_2$ and $Si_3N_4$ with aspect ratios (ARs) exceeding 100 is being challenged to maintain critical dimensions (CDs) and achieve high selectivity while etching stacks of materials for high capacity three-dimensional memory. Controlling and mitigating phenomena such as aspect ratio dependent etching (ARDE), bowing, and contact edge roughness are necessary to obtain anisotropic features and better critical dimension uniformity. HAR etching relies on high selectivity to a-C mask and maintaining mask profile (minimizing profile degradation) during HAR etching processes.

Etching processes are well-known. U.S. Pat. No. 9,514,959 B2, Fluorocarbon molecules for high aspect ratio oxide etch, discloses etchant chemicals and etching processes for HAR etching. In some etching processes, it has been demonstrated that a polymer removal step can improve HAR etching. Kim. Jong Kyu, et al. "Study on contact distortion during high aspect ratio contact $SiO_2$ etching." Journal of Vacuum Science & Technology A: Vacuum, Surfaces, and Films 33.2 (2015): 021303.

SUMMARY OF INVENTION

This disclosure describes an improved etch selectivity of a-C mask during HAR etch processes by using a cyclic etch process. The process has two principle steps:

1) A partial etch using a polymerizing etching recipe with lower $O_2$ and extra polymer generation where a-C mask selectivity to dielectric (e.g. for $SiO_2$ or ONON layers) is high; and 2) A polymer removal step using Kr sputter, Xe sputter; $NF_3$, $SF_6$, $IF_7$, $IF_5$, $CF_4$, or other F based etching process, with or without bias, to etch the polymer. The polymer removal step may include addition of O containing molecules such as $O_2e$, CO, $CO_2$, NO, $NO_2$, $N_2O$, $SO_2$, and/or COS.

These steps are repeated between a partial etch process (polymer creating) and polymer cleaning step (cycle etching).

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DETAILED DESCRIPTION OF PREFERRED EMBODIMENTS

Figure 1:
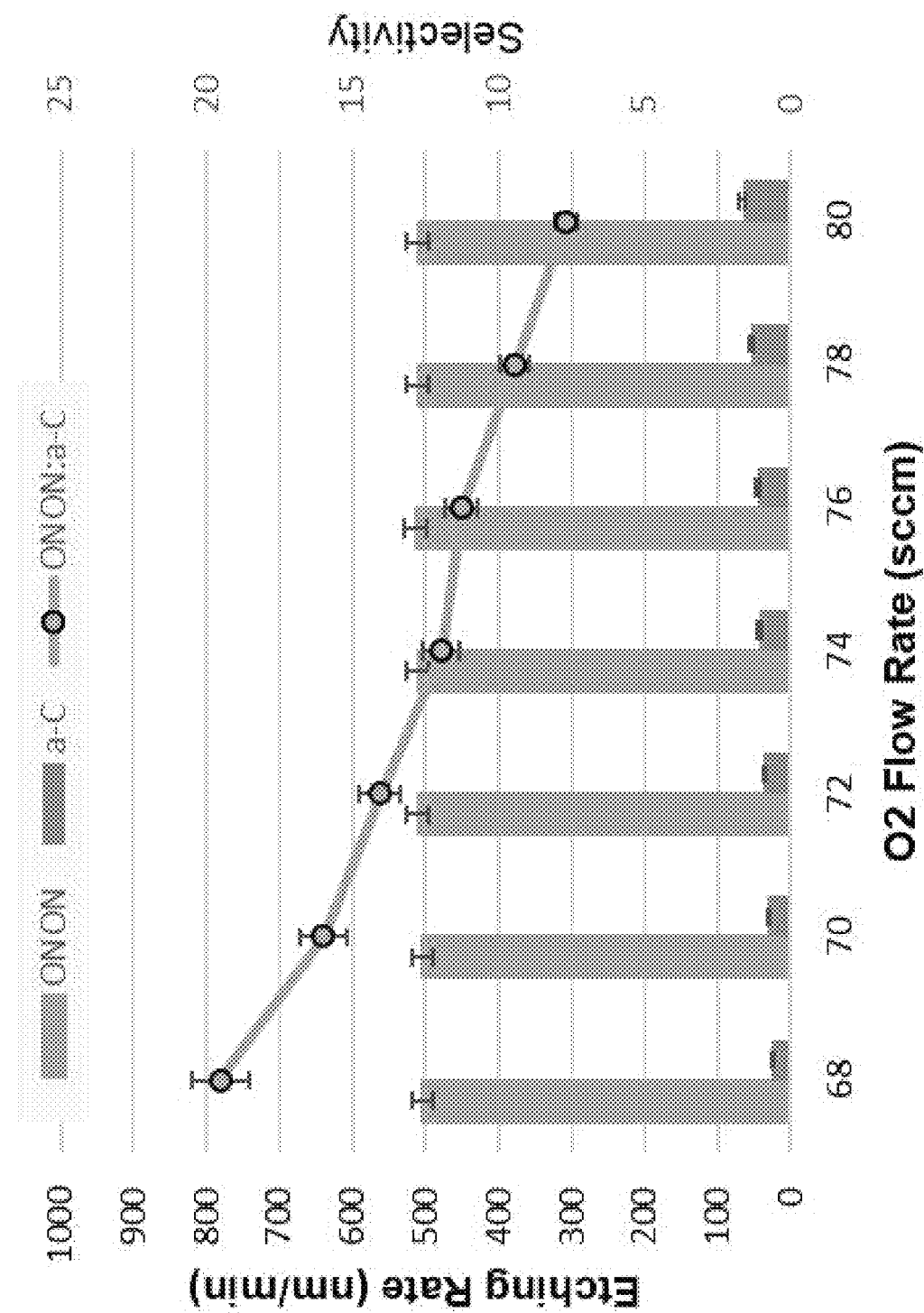
FIG. 1 is a graph showing selectivity (open circles) and etch rates (bar graph) at selected $O_2$ flow rates.

The Aspect Ratio of a geometric shape is the ratio of its sizes in different dimensions. The aspect ratio is most often expressed as two integer numbers separated by a colon (x:y). The values x and y do not represent actual widths and heights but, rather, the proportion between width and height. As an example, 8:5, 16:10, 1.6:1 are all ways of representing the same aspect ratio. In objects of more than two dimensions, such as hyperrectangles, the aspect ratio can still be defined as the ratio of the longest side to the shortest side. High Aspect Ratio (HAR) as used herein means an Aspect Ratio≥20 (or 1:20), such as ≥100 (or 1:100).

In some embodiments, one or more of the following details may be included in the cycle etching processes disclosed herein.

1) Substrates (e.g. wafer coupons) for HAR etching based patterning are placed in a RF plasma reactor chamber, in some embodiment on top of the RF electrode.

2) The reactor chamber is pumped down to a high vacuum (100 Torr or lower).

3) Etch gas(s) (such as $C_4H_2F_6$) and inert gas(s) (such as Ar, Kr, or Xe) are introduced to the RF plasma reactor chamber and allowed to equilibrate. The gases may include other hydrofluorocarbon etching gases such as C4F6, C4F8, CH2F2, CHF3, CH3F; as well as one or more additional gas additives such as CH3I, CS2, CF3I, C2F5I, C2F3I, C3F7I, C4F9I, or C2HF3I.

4) Next is the partial etching step in which the etching produces an intermediate patterned structure that can the further etched to yield a final intended patterned structure. The partial etching uses a lower oxidizing gas (such as $O_2$) flow rate. This lower oxidizing gas flow rate is selected to yield an etching process in which the selectivity of the etching of the target material over the amorphous-Carbon (a-C) mask (or other hard mask material) is 15. In this lower oxidizing etch with a selectivity≥15, the rate of etch gas polymer deposited on the a-C mask is relatively increased over higher oxidizing etch processes. This results in too much polymer build up (in many situations) to do a HAR pattern etch that yields etched pattern dimensions within the acceptable variances for the ultimate semiconductor device to function properly, or at least optimally function.

5) The partial etching step gases are evacuated and RF plasma reactor chamber is pumped down to high vacuum again.

6) Optionally, $N_2$ or another inert purge gas is flowed through the RF plasma reactor chamber for purging residual amounts of gas from the partial etch step. If done, the RF plasma reactor chamber is pumped down to high vacuum again.

7) A polymer removal step is then performed. Polymer cleaning gas is introduced to the RF plasma chamber and allowed to equilibrate. Polymer cleaning gas can be Kr, Xe, NF3, SF6, IF7, IF5, CF4, or other F rich gases. The polymer cleaning gas may include addition of O containing molecules such as O2, CO, CO2, NO, NO2, N2O, SO2, and/or COS.

8) Modulated source plasma, and optionally bias plasma, are turned on in the RF plasma reactor chamber and the substrates (e.g. wafer coupons) for HAR etching based patterning are processed for a specified time to remove some or all of the accumulated etching gas polymer coating the substrate.

9) Polymer cleaning gas is evacuated and the RF plasma reactor chamber is pumped down to high vacuum.

10) Optionally, $N_2$ or another inert purge gas is flowed through the RF plasma reactor chamber for purging residual amounts of gas from the partial etch step. If done, the RF plasma reactor chamber is pumped down to high vacuum again.

11) The above sequence 3)-10) is repeated until the final intended HAR patterned structure is reached (generally there is an etching resistant "etch stop layer" defining the bottom of the HAR structure).

Variations and Parameters for Optimizations

Embodiments of the general cycle etching process disclosed herein may include one or more of the following selections, options, or variations:

Plasma etching format: direct plasma, reactive ion etch, capacitive coupled plasma, inductive coupled plasma, remote plasma, pulsed plasma Etching gas pressure and polymer cleaning gas pressure can vary from 0.001 torr to 50 torr Etching and polymer removal temperatures can vary from 10° C. to 2000° C.

Flow rates for etching and polymer removal gases may be from 1 sccm to 10000 sccm Flow rates for inert gas may be from 1 sccm to 10000 sccm Inert gas may be Ar, Kr, Xe, He, or Ne Source plasma power may vary from 10 W to 20000 W Optional bias plasma power may vary from 10 W to 20000 W Plasma power ascending steps may vary from 1 to 10000

Plasma power descending steps may vary from 1 to 10000

Plasma etching and polymer removal process time may vary from 0.01 s to 10000 s

Optional $N_2$ (or other purge gas) purge time may vary from 1 s to 10000 s

Some preferred embodiments have one or more of the following:

Reactors: Capacitive Coupled plasma (CCP),
Pressure is from 15 mtorr to 1 Torr
Temperature is from 10 C to 50 C
a Flow rates for etch gas is from 1 sccm to 10 sccm
Flow rates for inert gas is from 10 sccm to 200 sccm
Inert gas is Ar
Partial etch step RF plasma power is vary from 50 W to 3000 W
Partial etch step process time is from 1 s to 30 s
Polymer removal step RF plasma power is from 50 W to 1000 W
Polymer removal step process time can vary from 1 s to 30 s
Optional $N_2$ (or other purge gas) purge time is from 10 s to 60 s Working Example(s)

Example 1-30 pairs ONON layer etch (selectivity increased from 7 to ~20)

Figure 2:
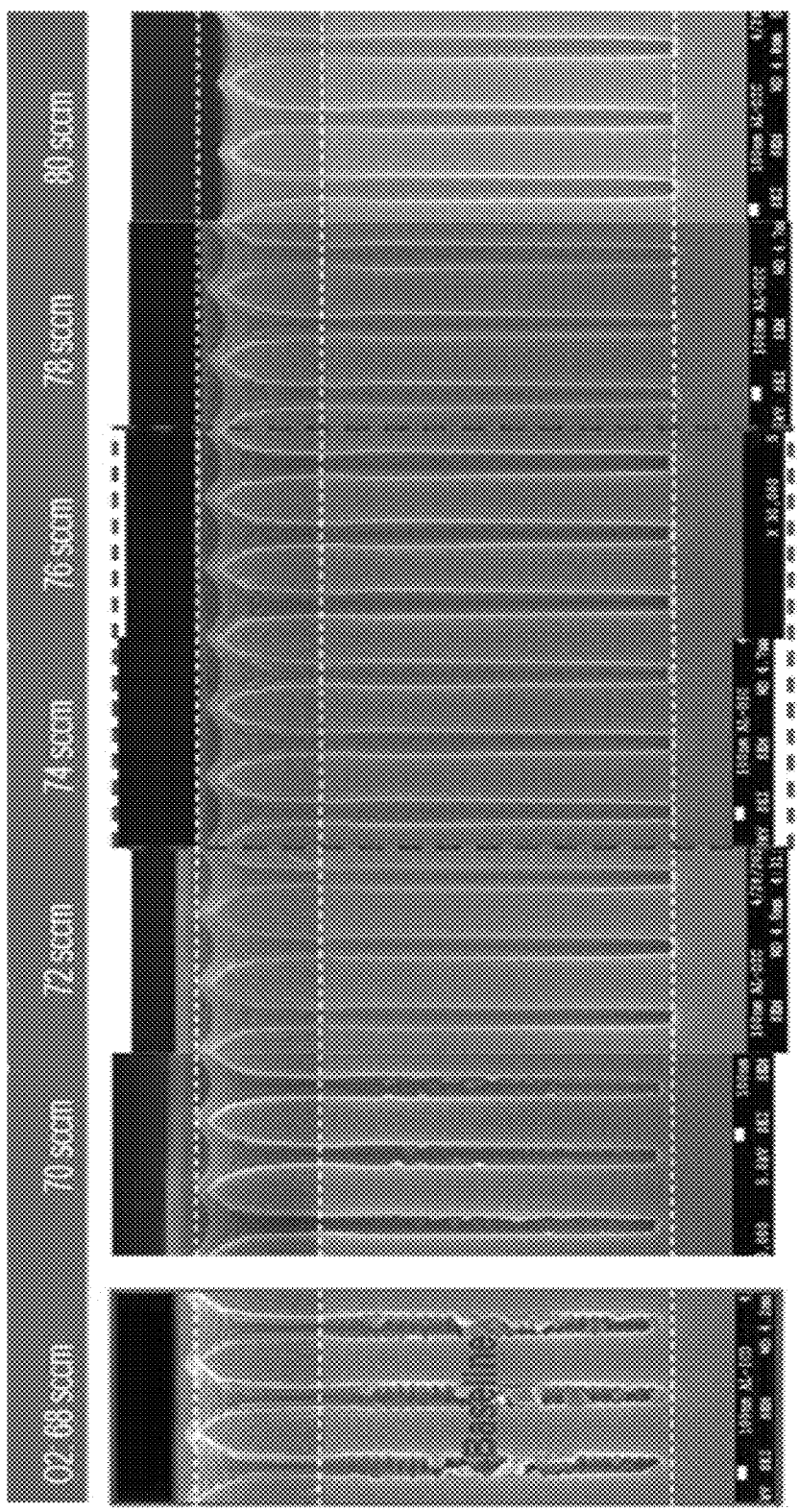
FIG. 2 is a series of representative electron micrographs of etched samples corresponding to the date of FIG. 1.

For ONON pattern etch, run the etch process at lower O2 flow condition (68 sccm to 80 sccm) to get selectivity of ONON to a-C mask more than 15. A polymer layer will be created on top of a-C mask and deform the mask profile. Then a polymer cleaning step (CF4 plasma at low plasma power level and no bias) is used to remove the polymer on the mask to maintain the profile shape of the mask. Higher selectivity can be obtained by cycling the partial etch process (polymer creating) and polymer cleaning step at certain time range. FIG. 1 show a graph of selectivity and etch rate vs. $O_2$ flow rate in sccm. The relationship between selectivity and oxidizer concentration is shown by the connected open circles and is fairly linear in this particular example. The underlying etch rates of the hard mask and the target ONON material are shown in bar graph form. As can be seen, the effective etch rate of the ONON material is essentially unchanged. Thus, the low oxidative, high selectivity regime does not adversely impact etching efficiency. Electron micrographs of exemplary etched substrate samples are shown in FIG. 2. Such imaging can be used to define optimal parameters for such things as the oxidizer flow rate (which correlates to oxidizer concentration and oxidative strength of the etching gas mixture), Bowing, contact edge roughness and critical dimension uniformity/variance can also be observed and optimized for.

NOTATIONS AND NOMENCLATURE

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims. The present invention may suitably comprise, consist or consist essentially of the elements disclosed and may be practiced in the absence of an element not disclosed. Furthermore, if there is language referring to order, such as first and second, it should be understood in an exemplary sense and not in a limiting sense. For example, it can be recognized by those skilled in the art that certain steps can be combined into a single step.

The singular forms "a", "an" and "the" include plural referents, unless the context clearly dictates otherwise.

"Comprising" in a claim is an open transitional term which means the subsequently identified claim elements are a nonexclusive listing (i.e., anything else may be additionally included and remain within the scope of "comprising"). "Comprising" as used herein may be replaced by the more limited transitional terms "consisting essentially of" and "consisting of" unless otherwise indicated herein.

"Providing" in a claim is defined to mean furnishing, supplying, making available, or preparing something. The step may be performed by any actor in the absence of express language in the claim to the contrary.

Optional or optionally means that the subsequently described event or circumstances may or may not occur. The description includes instances where the event or circumstance occurs and instances where it does not occur.

Ranges may be expressed herein as from about one particular value, and/or to about another particular value. When such a range is expressed, it is to be understood that another embodiment is from the one particular value and/or to the other particular value, along with all combinations within said range.

All references identified herein are each hereby incorporated by reference into this application in their entireties, as well as for the specific information for which each is cited.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A method for selectively etching a patterned structure into a substrate, the method comprising the steps of:
   a) in an etching chamber, performing a first partial etching by exposing the substrate to an etching gas or etching gas mixture and an oxidizing gas, under conditions and for a period of time sufficient to preferentially etch a first substrate material over a second substrate material, wherein a polymer of the etching gas is deposited on the substrate, and wherein the first partial etching produces an intermediate patterned structure on the substrate that can be further etched to yield a final intended patterned structure on the substrate,
   b) performing a first polymer removal step by exposing the substrate to a polymer removal gas or polymer removal gas mixture under conditions and for a period of time sufficient to remove some or all of the polymer formed in step a), and
   c) repeating steps a) and b) at least once,
   wherein the polymer removal gas or polymer removal gas mixture comprises one or more of Kr, Xe, $NF_3$, $SF_6$, $IF_7$, $IF_5$, and $CF_4$.

2. The method of claim 1, wherein the final intended patterned structure on the substrate comprises an aspect ratio of 1:20 or higher.

3. The method of claim 2, wherein the aspect ratio is 1:100 or higher.

4. The method of claim 1, wherein the first substrate material is $SiO_2$ or ONON and the second substrate material is a hard mask layer.

5. The method of claim 4, wherein the hard mask layer is an amorphous carbon containing hard mask layer.

6. The method of claim 1, further comprising a vacuum purge of the etching chamber between step a) and step b), and/or after step b) and before a subsequent step a).

7. The method of claim 6, further comprising a purge gas step and a second vacuum purge, both between step a) and step b), and/or after step b) and before a subsequent step a), wherein the purge gas flushes out of the etching chamber a residual gas from the prior step a) or step b).

8. The method of claim 1, wherein the polymer removal steps comprise forming a plasma of the polymer removal gas or polymer removal gas mixture.

9. The method of claim 1, wherein the partial etching steps comprise forming a plasma of the etching gas or etching gas mixture.

10. The method of claim 1, wherein the preferential etching comprising an etch rate selectivity of ≥15 for etching the first substrate material over a second substrate material.

11. The method of claim 1, wherein the etching gas or etching gas mixture comprises one or more of $C_4H_2F_6$, $C_4F_6$, $C_4F_8$, $CH_2F_2$, $CHF_3$, and $CH_3F$.

12. The method of claim 11, wherein the etching gas or etching gas mixture further comprises one or more of $CH_3I$, $C_2F_5I$, $C_2F_3I$, $C_3F_7I$, $C_4F_9I$, and $C_2HF_3I$.

13. The method of claim 1, wherein the polymer removal gas or polymer removal gas mixture further comprises one or more of $O_2$, CO, $CO_2$, NO, $NO_2$, $N_2O$, $SO_2$, and COS.

14. The method of claim 1, wherein the oxidizing gas comprises one or more of $O_2$, CO, $CO_2$, NO, $NO_2$, $N_2O$, $SO_2$, and COS.

15. The method of claim 1, wherein steps a) and b) are repeated more than once.

\* \* \* \* \*